: 
United States Patent [19]

Ahn

[11] Patent Number: 5,200,202
[45] Date of Patent: Apr. 6, 1993

[54] HEAD UNIT FOR A SEMICONDUCTOR LEAD FRAME LOADER

[75] Inventor: Dong H. Ahn, Seoul, Rep. of Korea

[73] Assignee: Hyundai Electronics Industries Co., Ltd., Kyungki, Rep. of Korea

[21] Appl. No.: 778,529

[22] Filed: Oct. 18, 1991

[30] Foreign Application Priority Data

Oct. 20, 1990 [KR] Rep. of Korea ............ 90-16802

[51] Int. Cl.⁵ .................. B29C 39/10; B29C 45/14; B29C 39/22
[52] U.S. Cl. .............................. 425/126.1; 901/37; 901/39; 294/106; 425/116; 425/117
[58] Field of Search ............ 425/126.1, 116, 117; 901/37, 39; 294/105, 115, 116, 117

[56] References Cited

U.S. PATENT DOCUMENTS

| | | | |
|---|---|---|---|
| 3,651,958 | 3/1972 | Evans et al. ............ | 294/115 |
| 4,286,380 | 9/1981 | Blount ............ | 294/106 |
| 4,569,550 | 2/1986 | Harigane et al. ............ | 294/116 |
| 4,628,594 | 12/1986 | Yamagami et al. ............ | 294/106 |
| 4,647,096 | 3/1987 | Lemmer ............ | 294/106 |
| 4,725,182 | 2/1988 | Sakamoto et al. ............ | 901/39 |

*Primary Examiner*—Willard Hoag
*Attorney, Agent, or Firm*—Merchant, Gould, Smith, Edell, Welter & Schmidt

[57] ABSTRACT

A head unit for a semiconductor lead frame leader including a vertical operating portion, a clamping portion having two pairs of jaws for clamping the lead frame and with the clamping portion interlocking with the vertical operating portion, a fixing portion with a pair of jaws secured thereto, an adjusting portion with a pair of jaws secured thereto for adjusting the distance separating each pair of jaws in order to accommodate different sizes of lead frames and which interlocks with the adjusting portion upper plate is disclosed.

11 Claims, 5 Drawing Sheets

HEAD UNIT FOR A SEMICONDUCTOR LEAD FRAME LOADER

BACKGROUND OF THE INVENTION

1. Field of the Invention

The present invention relates to a head unit for a semiconductor lead frame loader, and more particularly, to a head unit for an auto lead frame loader which automatically transfers a lead frame in a magazine to the upper side of a fixture prior to the molding process for manufacturing a semiconductor IC and especially a plastic-dual in line package (P-DIP), where the head unit is compatible and constructed in such a way that it can be easily modified and used without requiring a change of parts when the lead frame is changed.

2. Information Disclosure Statement

Generally, the prior art methods for transferring a lead frame for a plastic-dual in line package include the full magazine method which utilizes belts and transferring pins and the robot method which utilizes an orthogonal coordinate robot or a SCARA robot. The robot methods include the change-over-kit method and exclusive method.

The full magazine method is unreasonable in an industrial application since it is relatively labor intensive. Workers must participate since the parts are transferred and assembled utilizing belts or transferring pins. Furthermore, the method is a dedicated method requiring a change of the mechanism when the lead frame is changed, which increases the cost of manufacturing.

The mechanism for the change-over-kit method changes the head unit to suit a particular P-DIP strip which varies in its size depending on the size and capacity of the semiconductor to be produced. Therefore a separate head unit is required for each model of P-DIP strip which increases the cost of manufacturing. Also, there is the underling problems associated in replacing the head unit for each P-DIP strip.

The exclusive method also requires a different mechanism for each P-DIP strip which increases the cost of manufacturing.

SUMMARY OF THE INVENTION

The head unit for a semiconductor lead frame loader of the present invention is defined by the claims with a specific embodiment shown in the attached drawings.

The object of the present invention is to construct a head unit for a semiconductor lead frame loader by utilizing a vertical operating portion which approaches the lead frame supplied to suit the specification of each P-DIP strip, a clamping portion which clamps the lead frame, an adjusting portion which adjusts the position of the lead frame clamped by the clamping portion and a fixing portion, whereby the head unit can be generally used.

The vertical operating portion of the present invention consists of a first cylinder and four guiding rods combining a first upper plate and an intermediate plate. The clamping portion consists of a fixing piece fixed to a first shaft and operating in close relationship to a cylinder rod of a second cylinder, a pivoting jaw is interlocked with the fixing piece, side plates supporting a second upper plate at its both sides which fixes the second cylinder, and a pin portion fixed to a second shaft and a third shaft inserted between the side plates, and interlocks with the vertical operating portion. An adjusting portion consists of a fourth shaft (ball screw) which is provided with the power of a motor through a pulley and a belt and which is combined with a ball screw nut at its middle, an adjusting portion upper plate fixed to a housing which fixes the ball screw nut, and a pin portion which interlocks with the adjusting portion upper plate. The fixing portion consists of a fixing portion upper plate fixed to a housing opposite to a pulley of the fourth shaft, and a pin portion fixed to the fixing portion upper plate. The intermediate plate is fixed to a cylinder rod of the first cylinder. The fixing piece abuts the cylinder rod due to the tension force of a spring fixed to one side of the second cylinder. The jaws are arranged fore and aft in a pair, and a pair of pin portions are installed facing each other between the pair of jaws in one line. Two of the second upper plates make a set on a same horizontal plane, the front surface consists of the adjusting portion upper plate, and the rear surface consists of the fixing portion upper plate fixed to the intermediate plate. The pin portion consists of a pair of pin holders fixed to the second and third shafts and pins each fixed to each holder, the pin portion for the adjusting portion interlocks with the adjusting portion upper plate, and the adjusting portion upper plate changes rotational motion of the fourth shaft to linear motion of the housing which fixes the ball screw nut and the adjusting portion upper plate, so that the pin portion of the adjusting portion is fixed. The pin has a resilient force by a spring inserted into the pin holder. The second shaft is formed with a left handed screw and a right handed screw on its left and right with the center of it as a reference, and is formed with an adjusting knob on its one end. The motor is a DC serve motor or a stepping motor.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings. shaft 222, and jaw 224A and jaw 224B are fixed to a predetermined position on the first shaft 222.

The second cylinder 220 is fixed to a second upper plate 232, and a housing 336 which fixes a fourth shaft 335 is also fixed to the second upper plate 232. On both sides of the second upper plate 232 are integrated side plates 231, and the first, second and third shafts 222, 225, 226 are installed on the side plates 231. A cross roller guide 342 beneath both sides of the intermediate plate 113 and a guide protrusion 341 facing the cross roller guide 342 abut each other to guide a forward and rearward motion of the second upper plate 232. On the second shaft 225 are formed a left handed threaded portion and a right handed threaded portion with the center of the shaft as a reference and with a knob 344 secured to one end. The fourth shaft 335 on one side of which is provided a pulley 333 is supported by the housing 336 fixed to the intermediate plate and is connected to a motor 331 by a belt 334.

FIG. 3 is a side view of the present invention, where the first upper plate 111 and the intermediate plate 113 are connected to the first cylinder 110 and the guide rod 112, and the motor 331 is fixed to the intermediate plate by a supporting frame 114. On each side plate 231, 231' fixed to the second plate are installed the first, second and third shafts 222, 222', 225, 225' 226, 226'. On the first shaft 222 are installed jaws 224A, 224B and on the second shaft 225 and third shaft 226 are installed pin holders 227A, 227B. On the first shaft 222' are installed jaws 224C, 224D, and on the second shaft 225', and third shaft 226' are installed pin holders 227C, 227D. At the bottom of each pin holder 227A, 227B, 227C, 227D a pin 228A, 228B, 228C, 228D, respectively, is installed each of which is provided with a spring 230. Each pin holder 227A, 227B, 227C, 227D and each pin 228A, 228B, 228C, 228D constitute a pin portion 229A, 229B, 229C, 229D, respectively. A circle indicated by "C" shows a condition in which the jaw 224B engages the pin 228B and clamps one

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

Figure 1:
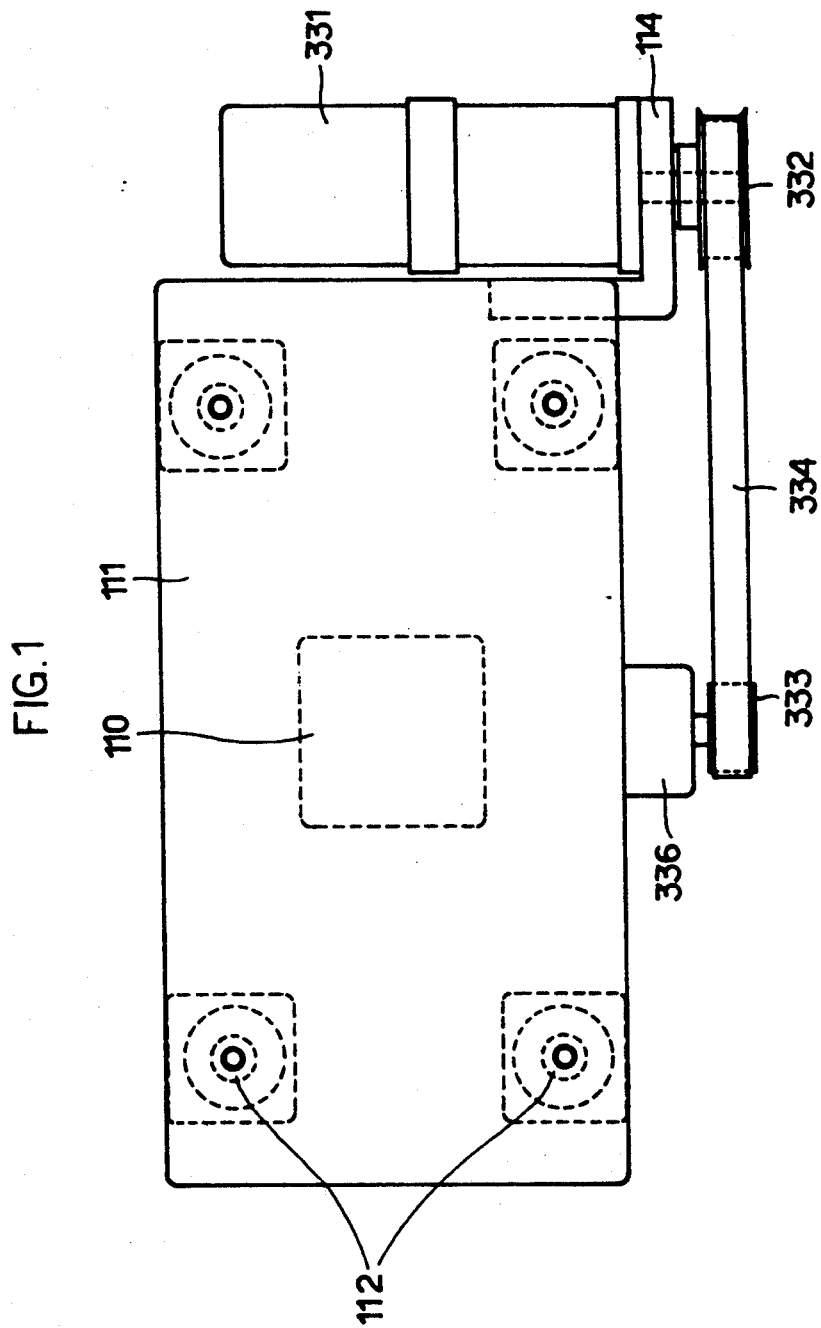
FIG. 1 is a plan view of the present invention.

FIG. 1 is a plan view of the present invention. Beneath the middle of a first upper plate 111 is fixed a first cylinder 110, and beneath four corners are fixed guide rods 112, and below one of the four corners a motor 331 is fixed on a supporting frame 114 and having a pulley 332. The pulley 332 is connected to a pulley 333 installed on a housing 336 by a belt 334 on a same line.

Figure 2:
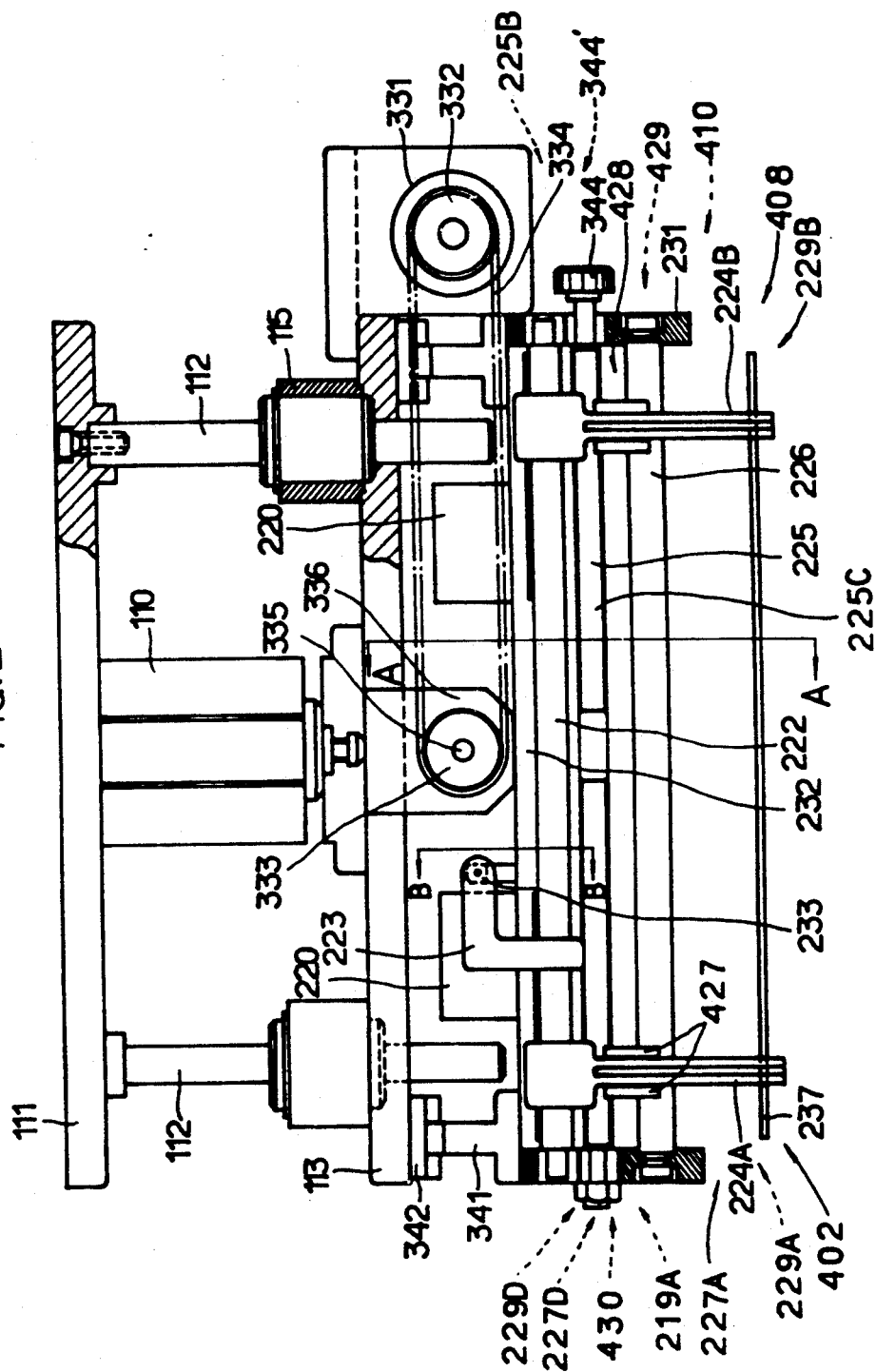
FIG. 2 is a partly broken front view of the present invention.

FIG. 2 is a front view of the present invention. The upper ends of the first cylinder 110 and the guide rods 112 are fixed to the first upper plate 111, and a intermediate plate 113 is fixed to a cylinder rod of the first cylinder 110, and the guide rods 112 constitute a vertical operational portion such that the intermediate plate 113 moves up and down together with housings 115 installed on the intermediate plate 113. A fixing piece 223 is closely installed to a cylinder rod of a second cylinder 220, and the bottom of the fixing piece 223 is fixed to a first end of a lead frame 237, looking at FIG. 3 from below.

Figure 4:
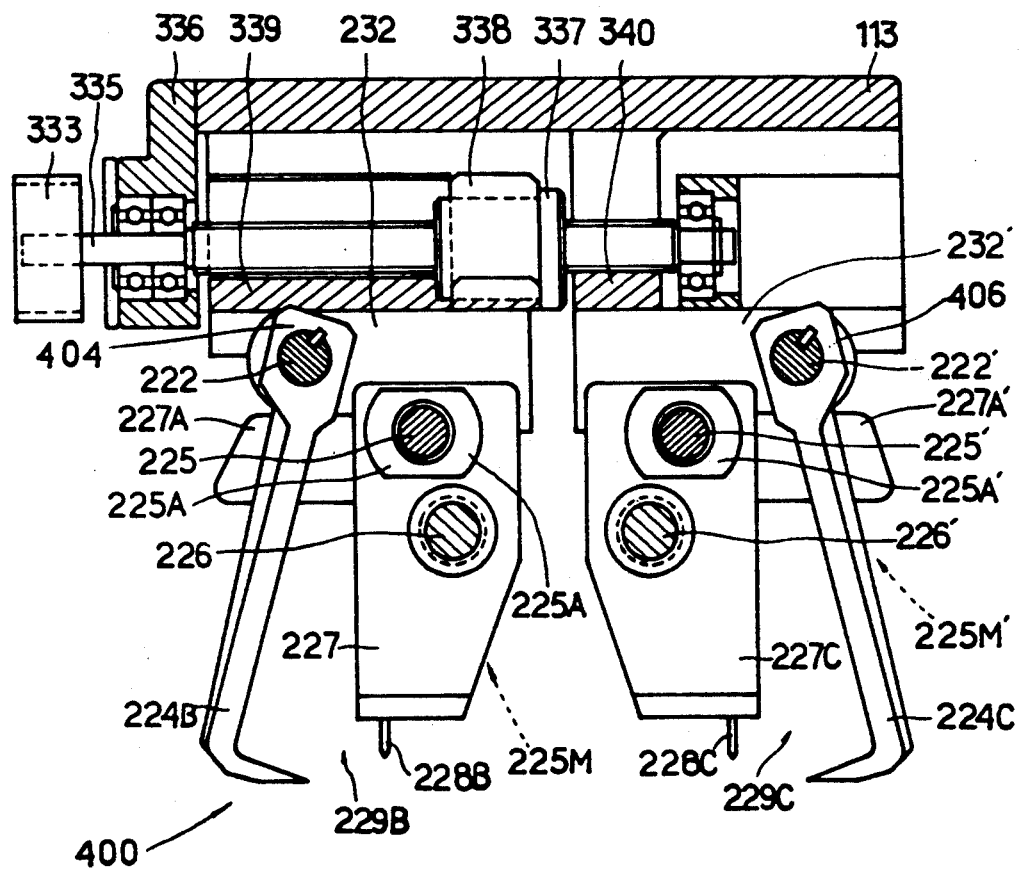
FIG. 4 is a sectional view taken along a line A—A of FIG. 2.

FIG. 4 is a sectional view taken along the line A—A of FIG. 2, where only the parts below the intermediate plate 113 is shown. Into the housing 336 fixed at one side of the intermediate plate 113 is inserted the fourth shaft 335 formed with thread at its middle, and at the middle of the tread a ball screw nut 337 inserted into a housing 338 and fixed therein is screwed onto the fourth shaft (ball screw) 335. Below the housing 338 is attached an adjusting portion upper plate 339 integral with a side plate 231. A fixing portion upper plate 340 integral with a side plate 231' is attached to the right side of the ball screw nut 337. On each side plate 231, 231' are installed a pair of the first, second and third shafts 222, 222', 225, 225', 226, 226'. The adjusting portion upper plate 339 and the fixing portion upper plate 340 are positioned on a same horizontal plane, and the two upper plates 339, 340 together are shown in FIG. 2 as the second upper plate 232.

Figure 3:
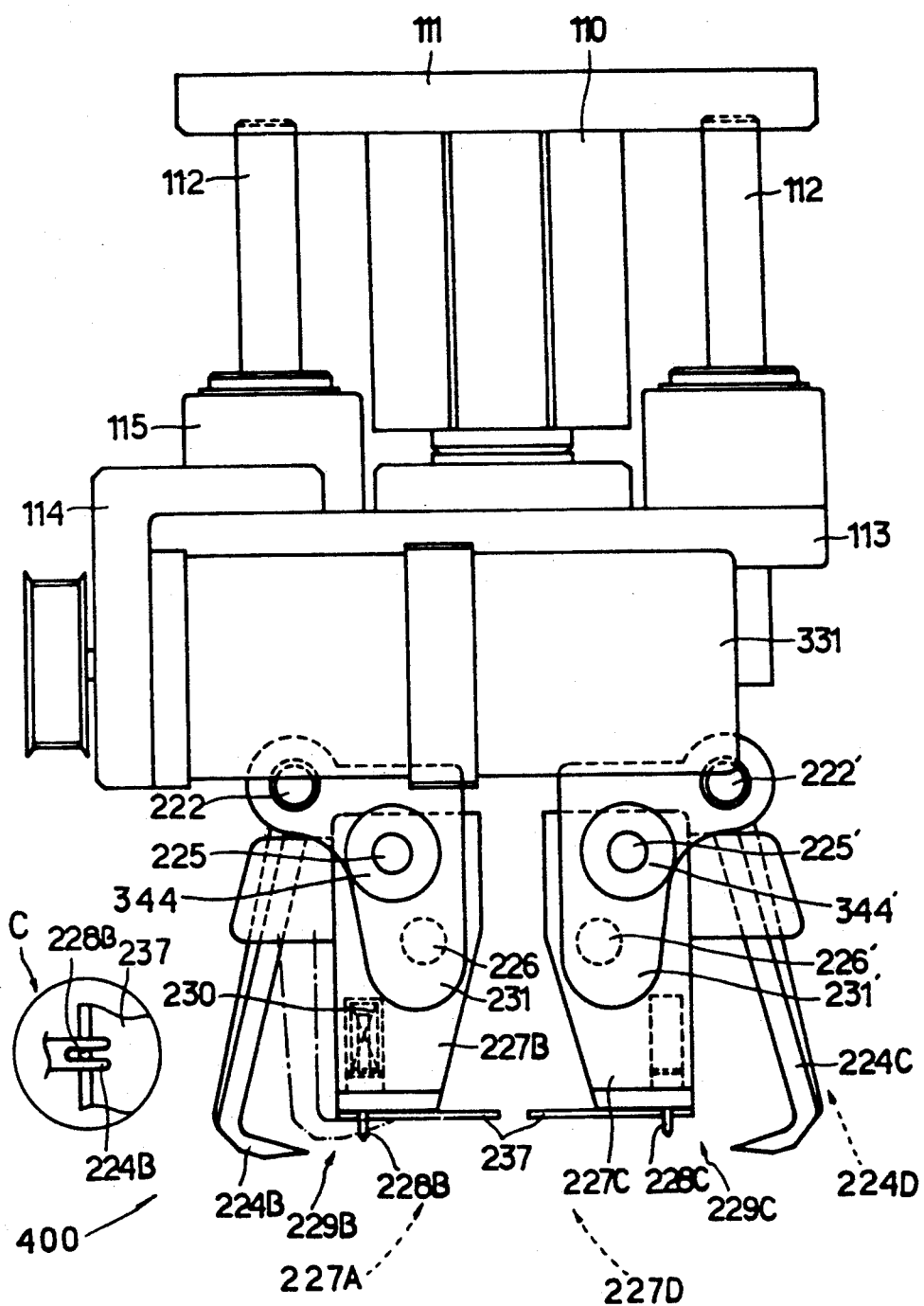
FIG. 3 is a side view of the right side of the present invention.

There are two opposing jaw-pin holder-guide member assemblies 400, 402 which are identical in structure and function. Accordingly, for sake of brevity, only one jawpin holder assembly 400 will be discussed and is illustrated at FIGS. 3 and 4.

Pin holders 227B 227C are received by the second shaft 225, 225', respectively. Each pin holder 227B, 227C is secured to a housing 225A, 225A', respectively, having internal threads. Both the second shaft 225' and the second shaft 225 are threaded shafts 225B, 225C, respectively. The surface of the shafts 225B and 225C, is threaded in one direction, e.g. clockwise, for one-half of the length are in an opposite direction, e.g. counter-clockwise, for the remaining one-half of the length of the shaft. This enables the housing threaded onto each threaded portion of each second shaft 225, 225', to move closer together or to move further apart upon rotation of the respective second shaft. That is, upon rotation of the knob 344, shaft 225 rotates and the jaws and pin holders secured the housing 225A on shaft 225 either move closer together or move further apart. Also, upon rotation of the knob 344', shaft 225' rotates and the jaws and pin holders secured to housing 225A' on shaft 225' either move closer together or move farther apart. It is noted that the housings 225A, 225A' mounted on the second shafts 225, 225', respectively, secure the jaws and pin holders to the second shafts 225, 225'.

This enables the second shafts 225, 225' to rotate upon rotation of knob 344, 344', respectively, such that in use the distance separating jaws 224A, 224B—pin holders 227A, 227B installed on the first shaft 222 and jaws 224C, 224D—pin holders 227C, 227D installed on the first shaft 222', respectively, may be increased or decreased. It is important to note that in FIG. 4 the keys 404, 406 are tightly secured in second shafts 225,225', respectively, but that the respective key is loosely fitted in jaws 224B, 224C to enable the jaws to slide along their respective shaft and yet be opened or closed as described herein.

A pair of guide members 427, 428, 429, 430 are fixed to each pin holders 227A, 227B, 227C, 227D, respectively. The guide member protrudes from the pin holder and a jaw is slidably inserted between the guide members.

A description of the interactions between the second shaft 225, 225', the pin holder 227B, 227C and the jaw 224B, 224C is given below with reference to FIGS. 2 and 4, the description being about only the left side part of FIG. 4 for convenience.

When the length of the lead frame to be transferred will change, an adjustment of the distance between the jaws 224A 224B is required for clamping the lead frame.

There are two in line jaw-pin holder-guide member assemblies 408, 410 which are identical in structure and function and are secured to threaded housings threadably engaged on second shaft 225 and 225', respectively. Accordingly, for sake of brevity, only one jaw-pin holder assembly 408 will be discussed in detail and illustrated at FIG. 2.

A knob 344, secured at one end of the second shaft 225, is rotated which rotates the second shaft 225 rotatably installed on both side-plates 231. At this time, the distance between the pin holders 227A and 227B is changed. That is, the internal threads formed on the inner surface of an opening in the housing 225A and the threads formed on the surface of the second shaft 225 enable the housing 225A to move along second shaft 225 upon rotation of second shaft 225. Therefore, the jaw 224B, guide member 428 and the pin holder 227B which are secured to the housing 225A move along the first shaft 222 and second shaft 225. Simultaneously, jaw 224A, guide member 427 and pin holder 227A secured to the housing 225M move upon rotation of second shaft 225 by knob 344 along first shaft 222 and second shaft 225. In like manner, the internal threads formed on the inner surface of an opening in the housing 225A' and the threads formed on the surface of the second shaft 225' enable the housing 225A, to move along second shaft 225' upon rotation of second shaft 225'. Simultaneously jaw 224C, guide member 429 and the pin holder 227C which are secured to the housing 225A' on second shaft 225' move along the first shaft 222' and second shaft 225' upon rotation of shaft 225' by rotating knob 344'.

Thus, the distance between the jaws for clamping a lead frame according to its length can be changed to accommodate the lead frame by rotating each of the second shafts 225, 225' enables the present invention to be effectively used for transferring of lead frames of various sizes without the need for structurally altering the frame loader as required with the prior art devices.

Figure 5:
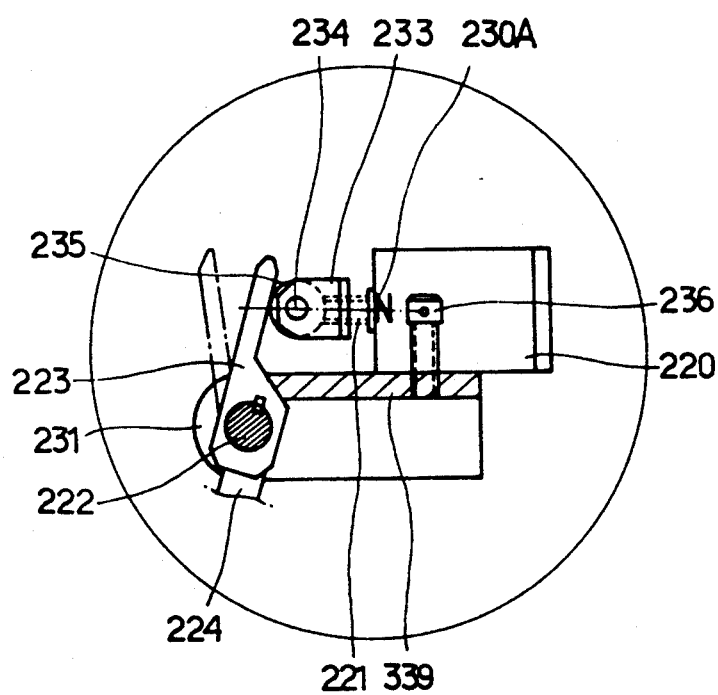
FIG. 5 is a sectional view taken along a line B—B of FIG. 2.

FIG. 5 is a sectional view taken along the line B—B of FIG. 2, where the second cylinder 220 is fixed to the adjusting portion upper plate 339. A ball bearing 235 is fixed to a cylinder rod 221 through a clevis 233 by a pin 234, and a protrusion 236 is installed at one side of the second cylinder 220 so that the upper portion of the fixing piece 223 fixed on the first shaft 222 abuts the ball bearing 235, whereby spring 230A is connected to the upper portion of the fixing piece 223 and to the protrusion 236.

The clamping portion of the present invention, as shown in FIGS. 2 to 5, consists of the fixing piece 223 which is closely installed to the cylinder rod 221 of the second cylinder and is fixed to the first shaft 222, 222', and which rotates the associated jaws upon manipulation of the fixing piece 223. The side plates 231, 231' support both sides of the second upper plate 232.

A fixing portion of the present invention, as shown in FIG. 2 and FIG. 4, consists of the fourth shaft 335 which is provided with a motor 331 to drive a pulley 332 and pulley 333 via belt 334 to rotatably a ball screw nut 337 at the middle of the shaft 335. Two of the second cylinders 220 constitute a set, one being fixed to the adjusting portion upper plate 339 of the second upper plate 232, and the other being fixed to the fixing portion upper plate 340 of the second upper plate 232.

The motor of the present invention is stepping motor or a DC motor.

The description of the operation and the effects of the embodiments of the present invention as shown in FIG. 1 to FIG. 5 is given below.

The present invention is the head unit for a semiconductor lead frame loader.

Where the lead frames 237 for operation are provided one set for front and back respectively as shown in FIG. 3 under the head unit as shown FIG. 2. When the provided lead frames 237 are placed under the pin portion 229B, 229C the cylinder rod of the first cylinder 110 starts to be lowered according to the sensed signal of a sensor (not shown). Then, the intermediate plate 113 integral with the first cylinder 110 is lowered, and the pin 228B, 228C of the pin portion 229B, 229C as shown in FIG. 3 and 4 is inserted into a hole of the lead frame 237 (refer to the circle C of FIG. 3). At the same time, the second cylinder 220 is operated and the cylinder rod 221 is extended.

At this time, the fixing piece 223 rotates together with the first shaft 222 to a position indicated by the dotted line as shown in FIG. 5 from a condition where the fixing piece 223 is fixed to the first shaft 222 and contacts the ball bearing 235 at the end of the cylinder rod 221 by a tension force of the spring 230A. As shown in FIG. 2, there are two second cylinder 220, both of which operate simultaneously, one operating to engage the fixing piece 223 to cause rotation of first shaft 222, the other second cylinder 220 operating to engage a second fixing piece (not shown) to cause rotation of first shaft 222'. As the jaw 224A, 224B and 224C, 224D is fixed to the first shaft 222, 222', respectively, the end of each jaw moves simultaneously to the under side of the lead frame inserted into the pin upon the rotation of the first shaft 222, 222' and clamps the lead frame (refer to the circle C of FIG. 3).

Once clamped, the first cylinder 110 is raised and the lead frame is transferred to a next work station by a separate transfer means (not shown) installed on the upper plate 111.

During transfer the motor 331 rotates according to the present input. When the motor 331 rotates, the rotational force is transferred to the fourth shaft 335 through the pulley 332, 333 and the belt 334. Since the fourth shaft 335 is formed with threads on its middle and is screwed into the ball screw nut 337 fixed to the housing 338, the jaw 224 and the pin portion 229 installed at the first, second and third shafts 222, 225, 226 are adjusted to fit the requirement of the next work together with adjusting portion upper plate 339 integral with the housing 338, and a slide of the adjusting portion upper plate 339 consists of two cross roller table.

At this time the rotational force of the fourth shaft 335 is converted to a force and aft linear motion by the housing 338 of the ball screw nut 337 and the adjusting portion upper plate 339. If the head unit arrives at a predetermined position (above the fixture), the first cylinder 110 is lowered again. Then, since the second cylinder 220 returns to its original position and the fixing piece 223 returns to its original position, the jaw 224 releases the lead frame 237.

Then, the head unit of the present invention returns to its original position so that the work is repeated. If, during the production of the lead frame, the model is changed, the position of the pins and the jaws can be adjusted. If the knob 344 shown in FIGS. 2 and 3 is rotated, the adjustment can be accomplished using the fact that the pin holders move toward the shaft 225, 225' because the left handed screw and the right handed screw are formed on the second shaft 225, 225'.

As described above, the present invention can overcome the problem of excessive investment because when the P-DIP strip is changed the head unit does not need to be replaced, so that the head unit does not have to be manufactured for each kind of the P-DIP strip.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A head unit for a semiconductor lead frame loader comprising:

a vertical operating portion comprising a first cylinder 110 and a plurality of guide rods 112 combining a first upper plate 111 and an intermediate plate 113;

a clamping portion comprising a fixing piece 223 fixed to first shafts 222, 222' and operating in close relationship to a cylinder rod 221 of a second cylinder 220, jaws 224A, 224B, 224C, 224D rotatable as being interlocked with the fixing piece 223, side plates 231, 231' supporting a second upper plate 232 at its both sides which fixes the second cylinder 220, and pin portions 229A, 229B, 229C, 229D, fixed to a second and third shafts 225, 225', 226, 226' inserted between the side plates, the clamping portion interlocked with the vertical operating portion;

an adjusting portion comprising a fourth shaft 335 which is provided with the power of a motor 331 through a pulley 332, 333 and a belt 334 and which is combined with a ball screw nut 337 at its middle, and adjusting portion upper plate 339 combined with a housing 338 which fixes the ball screw nut 337 and guide by two cross roller guides 342 fixed to the intermediate plate 113, and pin portions 229A, 229B which interlock with the adjusting portion upper plate 339;

a fixing portion comprising a fixing portion upper plate 340 fixed to a housing opposite to a pulley 333 of the fourth shaft 335, and pin portions 229C, 229D fixed to the fixing portion upper plate 340; and second shafts 225, 225', for adjusting the distance separating a pair of jaws 224A, 224B and 224C, 224D installed on said first shaft 222, 222', respectively, in order to adjust distance between said pair of jaws 224A, 224B and 224C, 224D, respectively, and each said second shafts 225, 225' further including a right hand threaded portion, a left hand threaded portion and a knob 344, 344' at an end thereof respectively such that in use the distance separating said pair of jaws 224A, 224B and 224C, 224D installed on first shaft 222, 222', respectively, can be adjusted by rotation of the second shafts 225, 225' in order to adjust distance between said pair of jaws 224A, 224B and 224C, 224D whereby the head unit can be adjusted to accommodate different sized lead frames.

2. The head unit of claim 1, wherein the intermediate plate 113 is fixed to a cylinder rod of said first cylinder 110.

3. The head unit of claim 1, wherein said fixing piece 223 contacts a cylinder rod 221 by a tension force of a spring 230A fixed to one side of the second cylinder 220.

4. The head unit of claim 1, wherein jaws 224A, 224D are situated proximate corresponding ends of said first shafts 222, 222', respectively, and jaws 224B, 224C are situated proximate the opposite ends of said first shafts 222, 222', respectively.

5. The head unit of claim 1, wherein two of the second upper plates 232 make one set on a same horizontal plane, the front surface consists of the adjusting portion upper plate 339, and the rear surface consists of the fixing portion upper plate 340 fixed to the intermediate plate 113.

6. The head unit of claim 1, wherein each said pin portion 229A, 229B, 229C, 229D includes a pin holder 227A, 227B, 227C, 227D, respectively, with said pin holders 227A, 227B and 227C, 227D secured to a pair of said second and third shafts 225, 226, and 225', 226', respectively, and with a pin 228A, 228B, 228C, 228D fixed to each holder 227A, 227B, 227C, 227D, respectively.

7. The head unit of claim 1, wherein the adjusting portion upper plate 339 being interlocked with said pin portion 229A and 29B converts rotational motion of said fourth shaft 335 into a linear motion of said housing 338 which fixes said ball screw nut 337 and said adjusting portion upper plate 339, whereby said pin portions 229A and 229B can be adjusted as to the distance separating said pin portions 229C and 229D.

8. The head unit of claim 6, wherein each said pin 228A, 228B, 228C, 228D is provided with a spring 230 inserted into each said respective pin holder 227A, 227B, 227C, 227D.

9. The head unit of claim 1 wherein each said pin holder 227A, 227B and 227D, 227C is secured to a housing 219A, 225A and 219B, 225A', respectively, with said housings 219A, 225A threadably engaged on said second shaft 225 and with said housings 219B, 225A' threadably engaged on said second shaft 225', and with said jaws 224A, 224B, 224C, 224D positioned between a pair of guide members 427, 428, 429, 430, respectively.

10. The head unit of claim 1, wherein said motor is either a DC servo motor or a stepping motor.

11. A head unit for a semiconductor lead frame loader for automatically transferring a lead frame in a magazine during the molding process of manufacturing a semiconductor and which accommodates different size P-DIP lead frame strips, said head unit comprising:

a first upper plate having a rectangular shape with a guide rod secured at each corner of said first upper plate with said guide rods extending vertically from said first upper plate;

an intermediate plate 113 slidably secured to each terminal end of said guide rods to enable movement of said intermediate plate along the axis of said guide rods;

a first cylinder 110 secured to said first upper plate and to said intermediate plate for moving said intermediate plate 113 relative to said first upper plate along the axis of said guide rods;

a pair of clamping members for clamping the lead frame secured to said intermediate plate 113 via said upper plate 339, 340 with each clamping member consisting of a fixing piece attached to a first shaft 222 having a pair of jaws 224A, 224B and a pair of pin holders 227A, 227B, slidably secured thereto and a first shaft 222' having a pair of jaws 224C, 224D and a pair of pin holders 227C, 227D, respectively, slidably secured thereto, with said jaws which close and open upon manipulation of said fixing piece by activation and deactivation of a second cylinder, respectively; and an adjusting member slidably secured to said intermediate plate 113 for adjusting the distances separating said jaws 224A, 224B, 224C, 224D and said pin holders 227A, 227B, 227C, 227D along both a width dimension and a length dimension in order to accommodate lead frames having different dimensions and comprising a fourth shaft 335 rotatably powered by a motor 331 with a ball screw nut 337 rotatably secured to said fourth shaft with said ball screw nut secured to an adjusting portion upper plate 339 such that upon activation of said motor the width separating said jaws 224A, 224D and 224B, 224C and said pin holders 227A, 227B, 227C, 227D changes, and comprising second shafts 225, 225' with said second shaft 225' being a right hand threaded shaft for one-half of its length and a left hand threaded shaft for its remaining length 225B, and with said second shaft 225 being a left hand threaded shaft for one-half of its length and a right hand threaded shaft for its remaining length 225C and with each said second shafts 225, 225' having a knob 344, 344' secured to each second shaft 225, 225' where upon rotation of said knob 344, 344' and with said jaws 224A, 224B, said pin holders 227A, 227B being secured to said second shaft 225 and said jaws 224C, 224D, said pin holders 227C, 227D secured to said second shaft 225' such that in use a distance separating said jaws 224A, 224B and pin holders 227A, 227B and said jaws 224C, 224D and said pin holders 227C, 227D slidably secured on said first shafts 222, 222', respectively, may be increased or decreased.

* * * * *

UNITED STATES PATENT AND TRADEMARK OFFICE
CERTIFICATE OF CORRECTION

PATENT NO. : 5,200,202
DATED : April 6, 1993
INVENTOR(S) : Dong Ho AHN

It is certified that error appears in the above-identified patent and that said Letters Patent is hereby corrected as shown below:

At column 2, line 46, after "drawings." delete "shaft 222, and jaw 224A and jaw 224B are fixed to a predetermined position on the first shaft 222.

The second cylinder 220 is fixed to a second upper plate 232, and a housing 336 which fixes a fourth shaft 335 is also fixed to the second upper plate 232. On both sides of the second upper plate 232 are integrated side plates 231, and the first, second and third shafts 222, 225, 226 are installed on the side plates 231. A cross roller guide 342 beneath both sides of the intermediate plate 113 and a guide protrusion 341 facing the cross roller 342 abut each other to guide a forward and rearward motion of the second upper plate 232. On the second shaft 225 are formed a left handed threaded portion and right handed threaded portion with the center of the shaft as a reference and with a knob 344 secured to one end. The fourth shaft 335 on one side of which is provided a pulley 333 is supported by the housing 336 fixed to the intermediate plate and is connected to a motor 331 by a belt 334.

FIG. 3 is a side view of the present invention, where the first upper plate 111 and the intermediate plate 113 are connected to the first cylinder 110 and the guide rod 112, and the motor 331 is fixed to the intermediate plate by a supporting frame 114. On each side plate 231, 231' fixed to the second plate are installed the first, second and third shafts 222, 222', 225, 225', 226, 226'. On the first shaft 222 are installed jaws

UNITED STATES PATENT AND TRADEMARK OFFICE
CERTIFICATE OF CORRECTION

PATENT NO. : 5,200,202

DATED : April 6, 1993

INVENTOR(S) : Don Ho AHN

It is certified that error appears in the above-identified patent and that said Letters Patent is hereby corrected as shown below:

224A, 224B and on the second shaft 225 and third shaft 226 are installed pin holders 227A, 227B. On the first shaft 222' are installed jaws 224C, 224D, and on the second shaft 225', and third shaft 226' are installed pin holders 227C, 227D. At the bottom of each pin holders 227A, 227B, 227C, 227D a pin 228A, 228B, 228C, 228D, respectively, is installed each of which is provided with a spring 230. Each pin holder 227A, 227B, 227C, 227D and each pin 228A, 228B, 228C, 228D constitute a pin portion 229A, 229B, 229C, 229D, respectively. A circle indicated by "C" shows a condition in which the jaw 224B engages the pin 228B and clamps one"

At column 3, line 55, delete "end of a lead frame 237, looking at FIG. 3 from below." and insert --shaft 222, and jaw 224A and jaw 224B are fixed to a predetermined position on the first shaft 222.

The second cylinder 220 is fixed to a second upper plate 232, and a housing 336 which fixes a fourth shaft 335 is also fixed to the second upper plate 232. On both sides of the second upper plate 232 are integrated side plates 231, and the first, second and third shafts 222, 225, 226 are installed on the side plates 231. A cross roller guide 342 beneath both sides of the intermediate plate 113 and a guide protrusion 341 facing the cross roller 342 abut each other to guide a forward and rearward motion of the second upper plate 232. On the second shaft 225 are formed a left handed threaded portion and right handed threaded portion with the center of the shaft as a reference and with a knob 344 secured to one end. The fourth shaft 335 on one side of which is provided a pulley 333 is supported by the housing 336 fixed to the intermediate plate and is connected to a motor 331 by a belt 334.

FIG. 3 is a side view of the present invention, where the first upper plate 111 and the intermediate plate 113 are connected to the first cylinder 110 and the guide rod 112, and

UNITED STATES PATENT AND TRADEMARK OFFICE
CERTIFICATE OF CORRECTION

PATENT NO. : 5,200,202
DATED : April 6, 1993
INVENTOR(S) : Don Ho AHN

It is certified that error appears in the above-identified patent and that said Letters Patent is hereby corrected as shown below:

the motor 331 is fixed to the intermediate plate by a supporting frame 114. On each side plate 231, 231' fixed to the second plate are installed the first, second and third shafts 222, 222', 225, 225', 226, 226'. On the first shaft 222 are installed jaws 224A, 224B and on the second shaft 225 and third shaft 226 are installed pin holders 227A, 227B. On the first shaft 222' are installed jaws 224C, 224D, and on the second shaft 225', and third shaft 226' are installed pin holders 227C, 227D. At the bottom of each pin holders 227A, 227B, 227C, 227D a pin 228A, 228B, 228C, 228D, respectively, is installed each of which is provided with a spring 230. Each pin holder 227A, 227B, 227C, 227D and each pin 228A, 228B, 228C, 228D constitute a pin portion 229A, 229B, 229C, 229D, respectively. A circle indicated by "C" shows a condition in which the jaw 224B engages the pin 228B and clamps one end of a lead frame 237, looking at FIG. 3 from below.--

Signed and Sealed this

Fifth Day of April, 1994

*Attest:*

BRUCE LEHMAN

*Attesting Officer*   Commissioner of Patents and Trademarks